US009373772B2

(12) United States Patent
Huminic et al.

(10) Patent No.: US 9,373,772 B2
(45) Date of Patent: Jun. 21, 2016

(54) CMOS INTEGRATED METHOD FOR THE RELEASE OF THERMOPILE PIXEL ON A SUBSTRATE BY USING ANISOTROPIC AND ISOTROPIC ETCHING

(71) Applicant: Excelitas Technologies Singapore Pte. Ltd., Solaris South Tower (SG)

(72) Inventors: Grigore D. Huminic, Baie d'Urfe (CA); Philippe Vasseur, Lachine (CA); Hermann Karagoezoglu, Wiesbaden (DE); Radu M. Marinescu, Pointe-Claire (CA)

(73) Assignee: Excelitas Technologies Singapore Pte. Ltd., Singapore (SG)

( * ) Notice: Subject to any disclaimer, the term of this patent is extended or adjusted under 35 U.S.C. 154(b) by 80 days.

(21) Appl. No.: 14/155,910

(22) Filed: Jan. 15, 2014

(65) Prior Publication Data

US 2015/0200347 A1     Jul. 16, 2015

(51) Int. Cl.
*H01L 35/34* (2006.01)
*H01L 27/146* (2006.01)

(52) U.S. Cl.
CPC .......... *H01L 35/34* (2013.01); *H01L 27/14649* (2013.01); *H01L 27/14683* (2013.01); *H01L 27/14689* (2013.01)

(58) Field of Classification Search
CPC .................................................. H01L 27/146
USPC .......................................................... 438/54
See application file for complete search history.

(56) References Cited

U.S. PATENT DOCUMENTS

| 4,558,342 A | 12/1985 | Sclar |
| 5,059,543 A | 10/1991 | Wise et al. |
| 5,283,459 A | 2/1994 | Hirano et al. |
| 6,294,787 B1 | 9/2001 | Schieferdecker et al. |

(Continued)

FOREIGN PATENT DOCUMENTS

| EP | 2416134 A1 | 2/2012 |
| JP | H09-133578 A | 5/1997 |

(Continued)

OTHER PUBLICATIONS

T. Ishikawa, "Low Cost 320X240 uncooled IRFPA using conventional Silicon IC process" Opto-electronics Review, 1999, vol. 7, No. 4 pp. 297-303.

(Continued)

*Primary Examiner* — Asok K Sarkar
*Assistant Examiner* — Dmitriy Yemelyanov
(74) *Attorney, Agent, or Firm* — Peter A. Nieves; Sheehan Phinney Bass & Green PA

(57) ABSTRACT

A method for manufacturing an imaging device is presented. The method starts with providing a wafer having a membrane with an opening bonded to a substrate. A photoresist layer is deposited over the membrane and wafer surface. A portion of the substrate back surface under a central part of the membrane is etched anisotropicly. A first region of the photoresist layer is removed, exposing an opening in the membrane, so that a first isotropic etching of the substrate is performed through the membrane opening. A second region of the photoresist layer is stripped, exposing a second membrane opening, providing access for a second isotropic etching of the substrate through the first and/or second membrane opening.

25 Claims, 4 Drawing Sheets

(56) References Cited

U.S. PATENT DOCUMENTS

| | | |
|---|---|---|
| 6,339,187 B1 | 1/2002 | Inoue |
| 6,458,615 B1 * | 10/2002 | Fedder ................ B81C 1/00246 216/79 |
| 6,476,455 B2 | 11/2002 | Toyoda et al. |
| 6,518,597 B1 | 2/2003 | Kim |
| 6,552,344 B1 | 4/2003 | Sone et al. |
| 6,870,086 B2 | 3/2005 | Hamamoto et al. |
| 6,900,518 B2 | 5/2005 | Udrea et al. |
| 6,927,102 B2 | 8/2005 | Udrea et al. |
| 7,282,712 B2 | 10/2007 | Shibayama |
| 7,863,063 B2 | 1/2011 | Tan |
| 8,742,528 B2 | 6/2014 | Yamamura et al. |
| 8,758,650 B2 | 6/2014 | Marinescu et al. |
| 2004/0113076 A1 | 6/2004 | Guo et al. |
| 2004/0146810 A1 * | 7/2004 | Gabriel ................ A61K 8/0208 430/322 |
| 2004/0169144 A1 | 9/2004 | Shibayama |
| 2005/0178967 A1 | 8/2005 | Nakaki et al. |
| 2006/0060788 A1 | 3/2006 | Uchida et al. |
| 2010/0289108 A1 | 11/2010 | Meinel et al. |
| 2011/0248374 A1 * | 10/2011 | Akin et al. .................... 257/470 |
| 2012/0037591 A1 | 2/2012 | Tringe et al. |
| 2013/0134542 A1 | 5/2013 | Lu et al. |

FOREIGN PATENT DOCUMENTS

| | | |
|---|---|---|
| JP | 2012026861 A | 2/2012 |
| JP | 2012026934 A | 2/2012 |
| WO | WO9931471 | 6/1999 |
| WO | 2013089824 A1 | 6/2013 |
| WO | WO2013120652 A1 | 8/2013 |

OTHER PUBLICATIONS

Extended European Search Report for EP14188311.6, dated Apr. 28, 2015.

European Search Report for EP14189783, dated Jun. 8, 2015.

European Search Report for EP14196780, dated May 19, 2015.

\* cited by examiner

CMOS INTEGRATED METHOD FOR THE RELEASE OF THERMOPILE PIXEL ON A SUBSTRATE BY USING ANISOTROPIC AND ISOTROPIC ETCHING

FIELD OF THE INVENTION

The present invention relates to semiconductor devices, and more particularly, is related to semiconductor wafer manufacturing processes.

BACKGROUND OF THE INVENTION

Infrared imagers are used in a large number of applications. Infrared imagers generally include an array of pixels. One limitation on the cost of producing infrared imagers is the pixel size. In general, a smaller pixel size allows the imager chip to have smaller dimensions, and thus a lower cost. However, previous manufacturing techniques for infrared imagers based on thermopiles as infrared sensing structures have been too imprecise to produce smaller pixels, for example, pixels with dimensions under 120 μm.

Imaging devices using thermopiles as sensing structures may include a thermopile structure suspended over a cavity in a semiconductor substrate, where a dielectric membrane of the thermopile has openings through to the cavity. Prior manufacturing methods have been challenged in ensuring the proper shape of the cavity under the membrane as well as a much higher precision in aligning this cavity with the position of the thermopile pixel. These features are especially needed when fabricating thermopile pixels which are smaller in size (for example, 120 μm or smaller).

The previous method of releasing the membrane for the thermopile pixels was based on anisotropic etching from the back of the membrane, for example, using deep reactive ion etching (DRIE). However, DRIE is generally not precise enough to ensure the correct positioning of the cavity under the membrane. The previous methods are typically limited to precision rates of +/−5 μm.

Another method involves wet anisotropic etching of the semiconductor substrate through openings in the membrane. While this method provides good control of the position and shape of the cavity relative to the position and shape of the membrane, the aggressive etchants used, for example, tetramethyl ammonium hydroxide (TMAH) etchant, are highly aggressive and will attack other structures present on the wafer, making the method unsuitable for integration with CMOS.

Dry isotropic etchants on the other hand, for example, xenon fluoride ($XeF_2$) is highly selective and will not attack other structures present on the wafer, making it suitable for integration with CMOS. Unfortunately, isotropic etching is unsuitable for etching deep cavities in the semiconductor substrate through openings in the membrane due to difficulties producing square/rectangular cavity shapes.

Other issues with the prior manufacturing methods include a relatively slow release of the membrane, and a relatively high consumption of $C_4F_8$. Therefore, there is a need in the industry to improve one or more of the abovementioned deficiencies.

SUMMARY OF THE INVENTION

Embodiments of the present invention provide a CMOS integrated method for the release of a thermopile pixel on a substrate by using anisotropic and isotropic etching. Briefly described, the present invention is directed to a method for manufacturing an imaging device, including the steps of providing a wafer having a first layer, a second layer, and a third layer, the second layer having a front surface adjacent to the first layer and a back surface adjacent to the third layer, anisotropic etching of a portion of the second layer back surface beneath a central part of the first layer, and performing a first isotropic etching through a third layer opening of a first portion of the second layer front surface through a first layer first opening.

A second aspect of the present invention is directed to a method for manufacturing an imaging device, including the steps of providing a wafer with a substrate having a first surface and a second surface opposite the first surface, and a membrane attached to the first surface, wherein the membrane includes an opening exposing the first surface, depositing a photoresist layer over the membrane and wafer first surface, masking a portion of the photoresist layer to form a first region and a second region, anisotropic etching a portion of the substrate second surface under a central part of the membrane, removing the first region of the photoresist layer, performing a first isotropic etching of the substrate through a membrane opening, stripping the second region of the photoresist layer, and performing a second isotropic etching of the substrate through the membrane opening.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

Figure 1A:
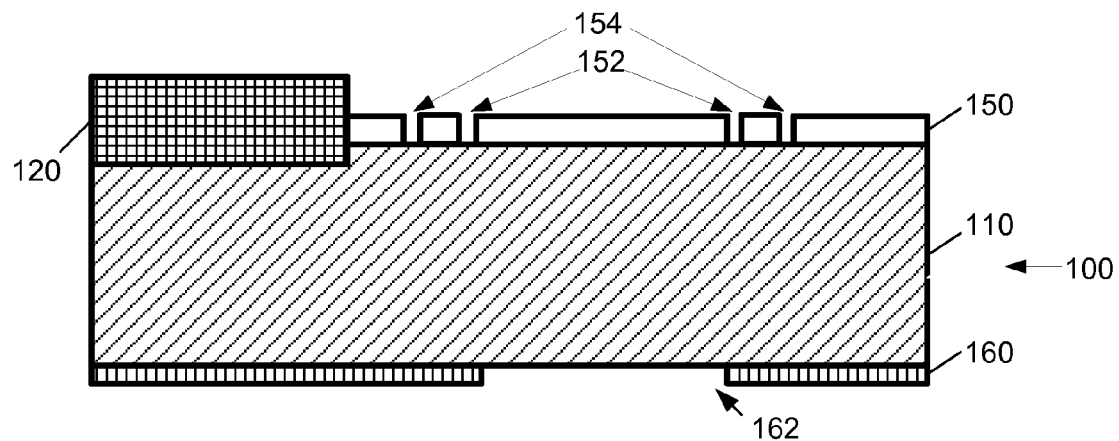
FIG. 1A is a schematic diagram of a wafer cross-section at the beginning of the exemplary method shown by FIG. 2.

The following definitions are useful for interpreting terms applied to features of the embodiments disclosed herein, and are meant only to define elements within the disclosure. No limitations on terms used within the claims are intended, or should be derived, thereby. Terms used within the appended claims should only be limited by their customary meaning within the applicable arts.

As used within this disclosure, "isotropic" means that the process proceeds at the same rate, regardless of direction, for example, during an industrial process, such as etching steps. Simple chemical reaction and removal of a substrate by an acid, a solvent or a reactive gas is often very close to isotropic. Conversely, "anisotropic" means that the attack rate of the substrate is higher in a certain direction. Anisotropic etch processes, where vertical etch-rate is high, but lateral etch-rate is very small are essential processes in microfabrication of integrated circuits and MEMS devices.

Reference will now be made in detail to embodiments of the present invention, examples of which are illustrated in the accompanying drawings. Wherever possible, the same reference numbers are used in the drawings and the description to refer to the same or like parts.

Exemplary embodiments of the present invention include a process for manufacturing an imaging device. The imaging device may be, for example, an infrared imager having an array of pixels, for example, but not limited to arrays of 32 by 32 pixels, 64 by 64 pixels, and 128 by 128 pixels. The imaging device includes a thermopile structure suspended over a cavity in a substrate having openings in the dielectric membrane. The thermopile is released from the substrate during the manufacturing process. An anisotropic etching of the silicon substrate under a central part of the membrane is performed from the back of the wafer. One or more topside isotropic etchings of the silicon substrate under outer regions of the membrane are performed through the membrane openings.

Figure 1B:
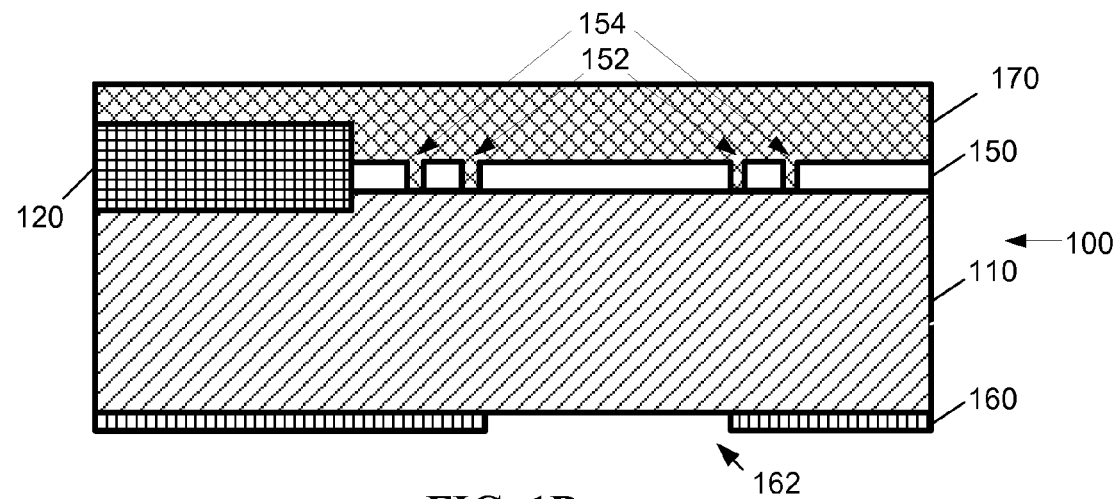
FIG. 1B is a schematic cross-section diagram of the wafer of the exemplary method shown by FIG. 2 with a photoresist layer.
Figure 1C:
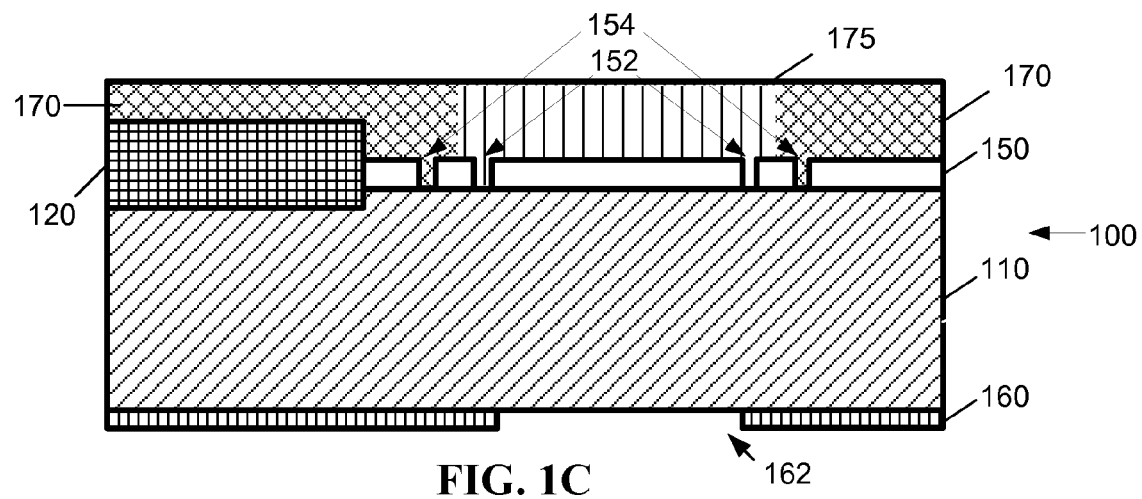
FIG. 1C is a schematic cross-section diagram of the wafer of the exemplary method shown by FIG. 2 after exposing a region of the photoresist layer.
Figure 1D:
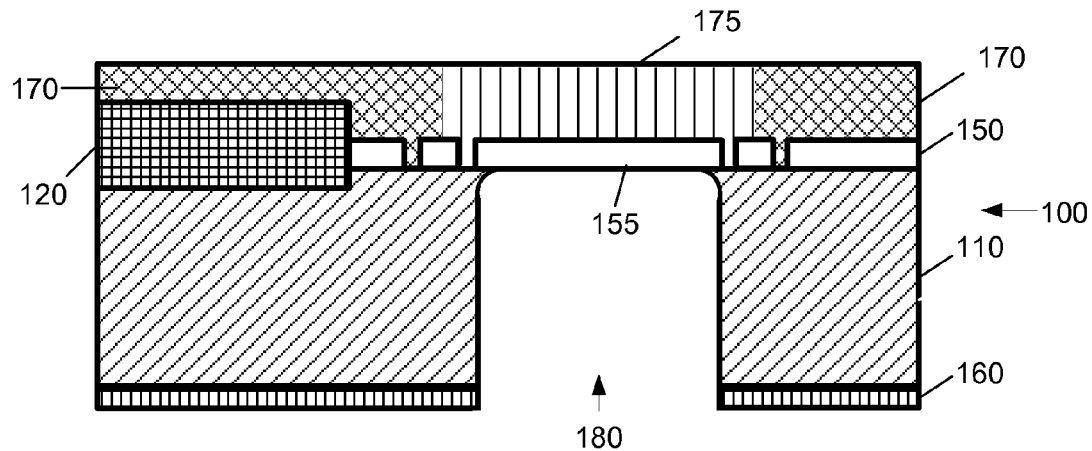
FIG. 1D is a schematic cross-section diagram of the wafer of the exemplary method shown by FIG. 2 after anisotropic etching.
Figure 1E:
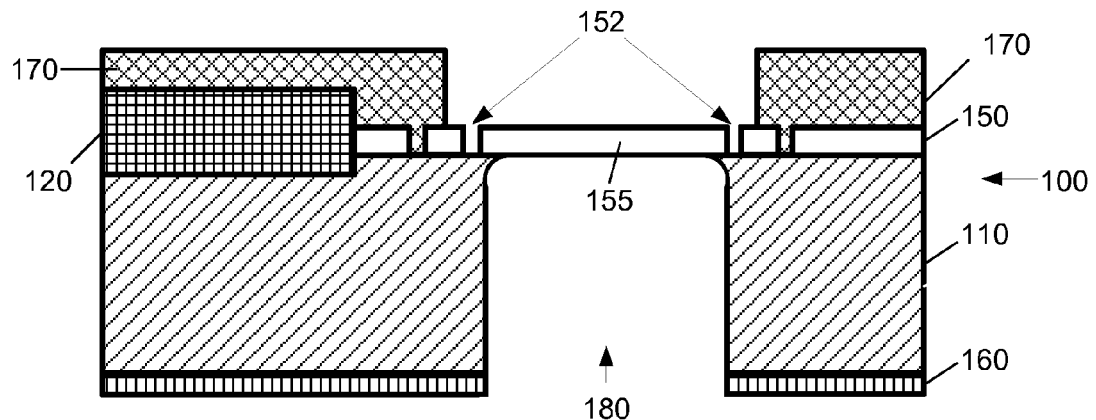
FIG. 1E is a schematic cross-section diagram of the wafer of the exemplary method shown by FIG. 2 after removing by developing the previously exposed region of the photoresist.
Figure 1F:
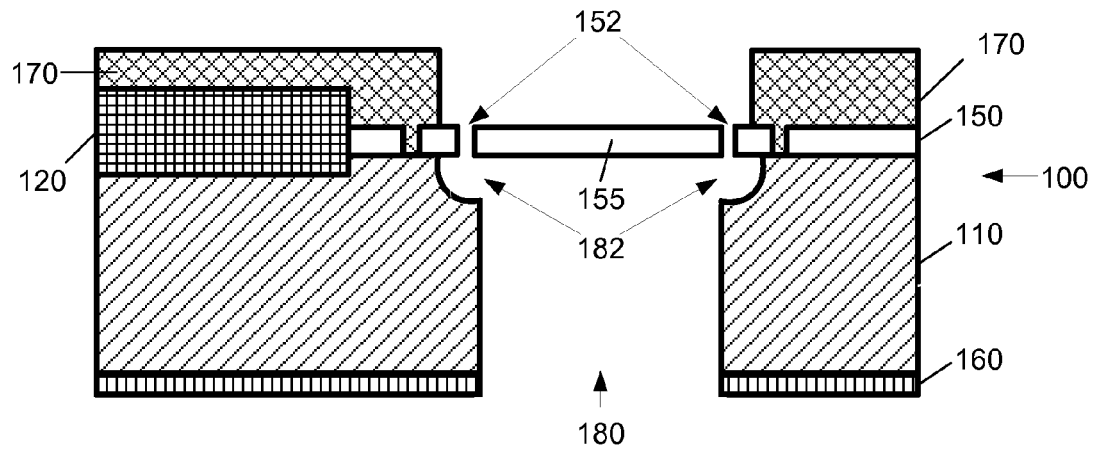
FIG. 1F is a schematic cross-section diagram of the wafer of the exemplary method shown by FIG. 2 after a first isotropic etching.
Figure 1G:
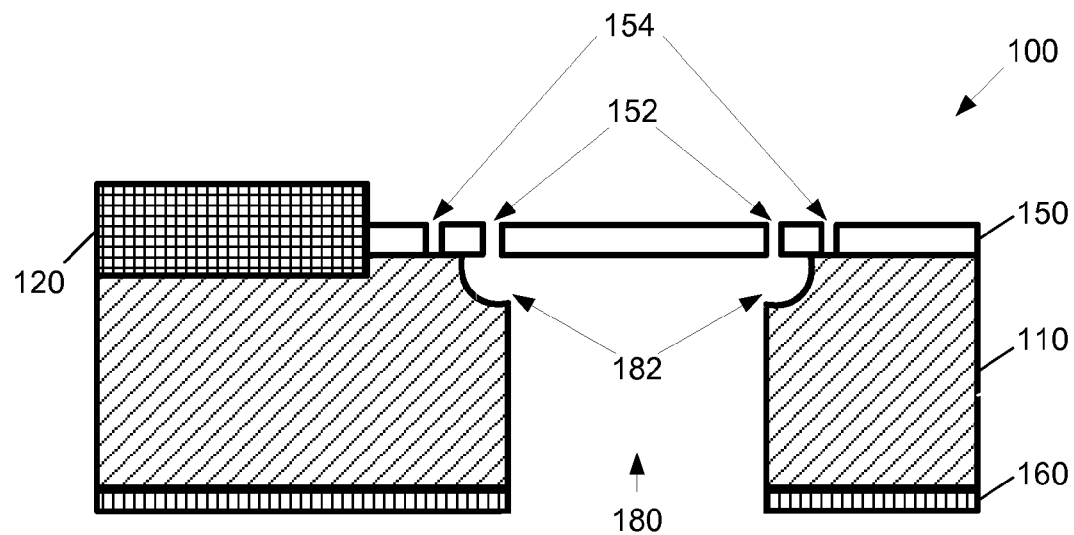
FIG. 1G is a schematic cross-section diagram of the wafer of the exemplary method shown by FIG. 2 after removing a second region of the photoresist.
Figure 1H:
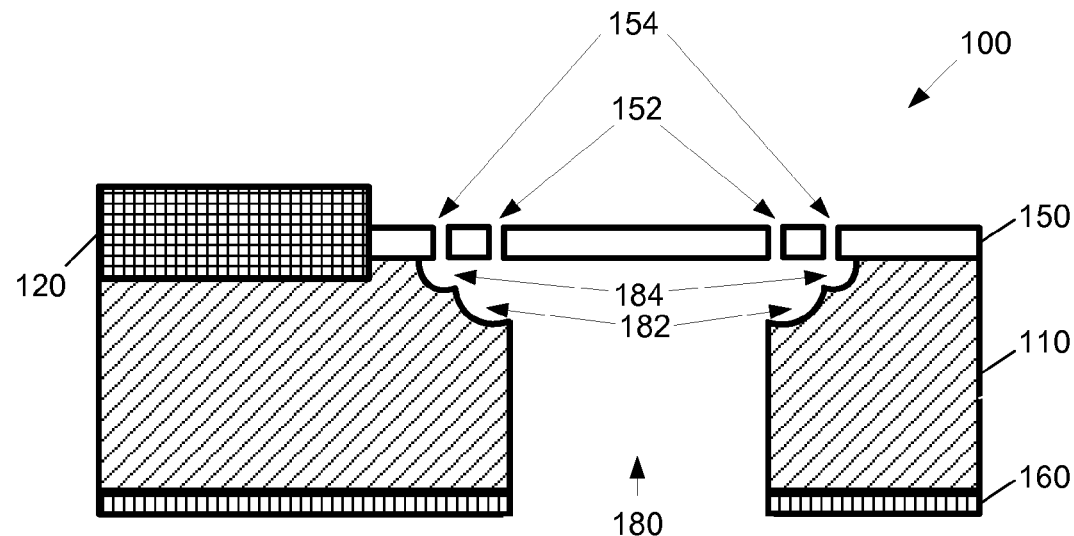
FIG. 1H is a schematic cross-section diagram of the wafer of the exemplary method shown by FIG. 2 after a second isotropic etching.
Figure 2:
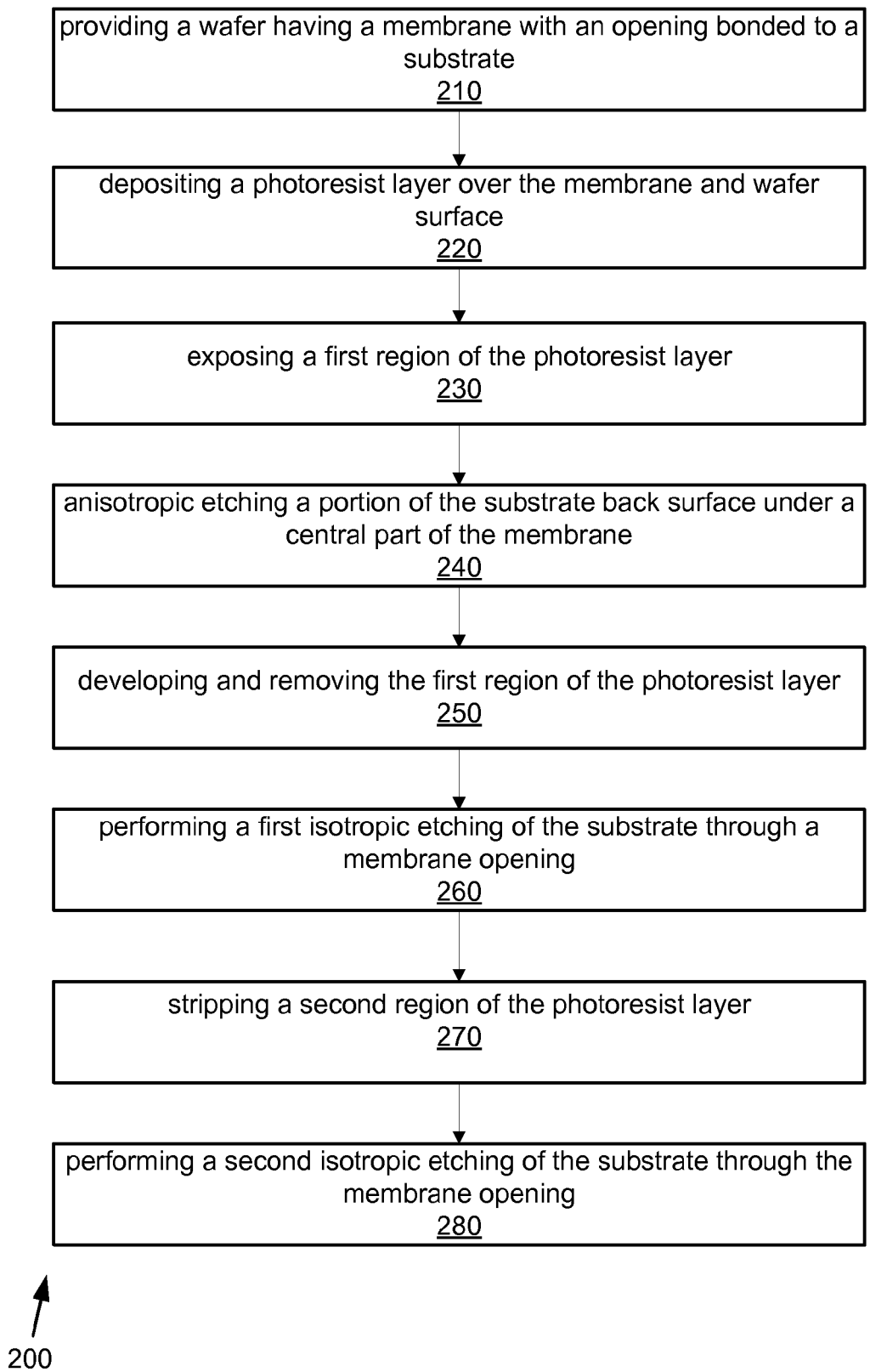
FIG. 2 is a flowchart of a first exemplary method of forming an imaging device.

A flowchart of a first exemplary method for manufacturing an imaging device is shown in FIG. 2. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention. The state of the imaging device at various steps of the first exemplary embodiment is shown in cross-section by FIGS. 1A-1H.

The first embodiment 200 of a method for manufacturing an imaging device includes the following steps. A wafer 100 including a membrane 150 having one or more openings 152, 154 deposited on a substrate 110 is provided, as shown by block 210 and FIG. 1A. The membrane 150 is deposited on a first (top) surface of the substrate 110. The membrane openings 152, 154 expose a portion of the substrate 110 top surface. The membrane openings 152, 154 may be of various shapes, for example, circular, or the membrane openings 152, 154 may be straight or curved slots in the membrane 150. The membrane 150 is generally formed of one or more dielectric layers such as silicon dioxide and silicon nitride, incorporating thermopile structures fabricated in materials such as polysilicon. The membrane 150 may be deposited on the substrate 110 via several techniques familiar to persons having ordinary skill in the art, for example, low pressure vapor deposition or plasma enhanced vapor deposition, among other techniques.

The substrate 110 of the wafer 100 is generally thicker than the membrane 150. A non-limiting exemplary range of thicknesses of the substrate 110 may be 300-600 μm, while a non-limiting exemplary thickness range of the membrane 150 may be 0.5-1.5 μm. It should be noted that the dimensions of the various elements of the wafer 100 in FIGS. 1A-1H may not be depicted to scale.

The substrate 110 is generally formed of an appropriate semiconductor material, for example silicon, germanium, silicon germanium, or gallium arsenide, properly doped in order to accommodate the fabrication of the CMOS structures 120. The wafer 100 also may include one or more CMOS structures 120, for example, but not limited to shift registers and/or NMOS switches. The CMOS structures 120 are generally vulnerable to anisotropic and/or isotropic etching agents and procedures, so it is desirable to separate and/or isolate the CMOS structures 120 from the regions where anisotropic etching is performed. It should be noted that while FIGS. 1A-1H depict a single CMOS structure 120 in a single location on the wafer 100, alternative embodiments may include two or more CMOS structures on different locations of the wafer 100.

A mask layer 160 is deposited on a second (back) side of the substrate 110. The mask layer 160 may be a photoresist layer, a dielectric mask, or metal layer, for example aluminum or chromium, to resist dry anisotropic etching agents, for example fluorine- based agents, as used for deep reactive ion etching (DRIE). An opening 162 in the mask layer 160 exposes the substrate 110 back side. The opening 162 is shaped according to the desired shape of a cavity to be formed in the substrate 110 behind a central portion 155 (FIG. 1D) of the membrane 150. For example, the shape of the opening 162 may be rectangular, or circular, among other shapes. The opening 162 is generally located according to the location of the central portion 155 (FIG. 1D) of the membrane 150.

As shown by block 220 and FIG. 1B, a photoresist layer 170 is deposited, for example, by spinning or spray coating over the membrane 150, the CMOS structures 120, and the portions of the wafer 110 top surface exposed through the holes 152, 154 in the membrane 150. The photoresist layer 170 is generally a positive resist, where a portion of the photoresist 175 (FIG. 1C) that is exposed to light becomes soluble to a photoresist developer. The remaining portion of the photoresist layer 170 that is unexposed remains insoluble to the photoresist developer.

A selective portion 175 of the photoresist layer is exposed to a light, where the remaining portion is masked from the light by a mask (not shown) applied to the photoresist layer 170, as shown by block 230 and FIG. 1C. The selective portion 175 of the photoresist layer generally covers the central portion 155 (FIG. 1D) of the membrane 150, as well as one or more inner openings 152 in the membrane 150. However, the selective portion 175 of the photoresist layer does not extend to one or more outer openings 154 in the membrane 150.

A portion of the substrate 110 back surface under a central portion 155 of the membrane 150 is etched by anisotropic etching, as shown by block 240 and FIG. 1D, to form a cavity 180 in the substrate 110. Here, the membrane 150 acts as etch stop layer to the anisotropic etch. For example, the cavity 180 may be formed in a region of the substrate 110 located directly below the central portion 155 of the membrane 150. The cavity 180 is formed by removing a portion of the substrate 110 revealed by the hole 162 (FIG. 1C) in the mask layer 160. The cavity generally does not extend to the edges of the central portion 155 of the membrane 150. In particular, the one or more inner openings 152 in the membrane 150 may not extend into the cavity 180.

The etching is done from the back of the substrate 110 using an anisotropic etching process, for example, DRIE. The etching generally penetrates through the whole thickness of the substrate 110. In general, irregularities in the cavity 180 remaining after DRIE may be cleaned/removed, for example, with wet tetramethyl ammonium hydroxide (TMAH) etching solution. It should be noted that while TMAH is a highly aggressive etchant and, without taking preventative measures, will attack other structures on the wafer 100, such as the CMOS structures 120. However, TMAH may be used from the back side of the wafer 100 so that the CMOS structures 120 are not exposed to TMAH.

The selective portion 175 (FIG. 1D) of the photoresist layer 170 is removed, for example, using a photoresist developer, as shown by block 250 and FIG. 1E. The remaining photoresist layer 170 not removed with the selective portion 175 covers the outer holes 154 in the membrane 150, as well as the CMOS structures 120. The inner holes 152 in the membrane 150 are revealed, exposing material of the substrate 110 at the edge of the cavity 180.

Once the inner holes 152 in the membrane 150 have been revealed, a first isotropic etching of the substrate 110 is performed from the front of the wafer 100 through the membrane inner holes 152 opening, as shown by block 260 and FIG. 1F. The first isotropic etching may use a vapor etchant, for example xenon fluoride $XeF_2$, ensuring good control of position of the cavity relative to the position of the membrane 150. The isotropic nature of $XeF_2$, while unsuitable for forming square or rectangular cavity shapes, is desirable for extending the cavity 180. In particular, the first isotropic etching forms first cavity extensions 182, which extend the cavity 180 such that the inner holes 152 of the membrane 150 provide a channel from the top side of the wafer 100 through the membrane 150 to the cavity 180.

The remaining region of the photoresist layer 170 (FIG. 1F) is stripped, as shown by block 270 and FIG. 1G. This removal of the photoresist layer 170 (FIG. 1F) exposes the outer openings 154 in the membrane 150, as well as the CMOS structures 120. The top surface of the substrate 110 is exposed through the outer openings 154 in the membrane 150.

A second isotropic etching of the substrate 110 is performed through the outer openings 154 in the membrane 150, and/or the inner openings 152 in the membrane 150 as shown by block 280 and FIG. 1H. The second etching may use the same isotropic etching agent as the first isotropic etching, or may use a different isotropic etching agent. For example, the second isotropic etching may use a vapor etchant, for example xenon fluoride $XeF_2$.

The second isotropic etching forms second cavity extensions 184, which extend the cavity 180 such that the outer holes 154 provide a channel from the top side of the wafer 100 through the membrane 150 to the cavity 180. In addition, the second isotropic etching may expand the first cavity extensions 182 into the cavity 180.

As described above, the exemplary method ensures the proper shape of the cavity 180 under the membrane 150 as well as providing much higher precision in aligning this cavity with the position of the thermopile pixel when compared to prior methods. This is particularly relevant when fabricating thermopile pixels which are relatively small in size, for example, 120 µm or smaller. In addition, use of this method results in release of the membrane on the order of five times faster than prior methods. Further, this method produces less $C_4F_8$ in comparison with prior methods.

The first exemplary method includes an anisotropic etching followed by two isotropic etchings. In alternative embodiments, the anisotropic etching step may be followed by one, three, four, or more isotropic etchings, depending, for example, on the number, size, location, and shape(s) of the membrane openings.

In comparison, with prior manufacturing methods using anisotropic etching alone, the anisotropic etching from the back had to penetrate through the whole thickness of the wafer, for example, a thickness on the order of 400 µm. This, together with front-to-back alignment variability, prevented the prior method from reliably defining an opening under the membrane with a precision on the order of +/−1 µm in terms of size and positioning.

Prior art methods using only isotropic etching from the front may be intrinsically well aligned with the front side pattern. However, due to the character of isotropic etching, large undercuts occur outwards under the membrane if this process is used alone to release the entire pixel. Anisotropic etching of the back side of the wafer, coupled with the isotropic etching of the top side of the wafer, as described above, provides increased precision.

In summary, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing an imaging device, comprising the steps of:
   providing a wafer comprising a first layer, a second layer, and a third layer, the second layer having a front surface adjacent to the first layer and a back surface adjacent to the third layer, the first layer having a pair of inner openings therethrough;
   anisotropic etching of a portion of the second layer back surface beneath a central part of the first layer to form a cavity between the pair of inner openings, the pair of inner openings not extending into the cavity; and
   performing a first isotropic etching of a first portion of the second layer front surface through the pair of inner openings to form cavity extensions such that the pair of inner openings provide a channel from a top side of the wafer through the first layer into the cavity.

2. The method of claim 1, wherein the first layer comprises a membrane and a thermopile structure.

3. The method of claim 2, wherein the second layer comprises a semiconductor substrate.

4. The method of claim 3, wherein the semiconductor substrate comprises one or more of the group consisting of silicon, germanium, silicon germanium, and gallium arsenide.

5. The method of claim 1, wherein the anisotropic etching penetrates through substantially a whole thickness of the second layer.

6. The method of claim 5, wherein the anisotropic etching is performed through an opening of the third layer aligned with the pair of inner openings opening of the first layer and CMOS structures of the second layer.

7. The method of claim 5, wherein the second layer is between 50 and 600 µm thick.

8. The method of claim 1, further comprising the step of performing a second isotropic etching of a second portion of the of the second layer front surface through the first layer pair of inner openings and/or a first layer pair of outer openings.

9. The method of claim 8, wherein: the first and/or second isotropic etching is aligned with a front surface pattern.

10. The method of claim 1, further comprising the steps of:
removing a first mask from the first layer; and
removing a second mask from the first layer.

11. The method of claim 10, wherein the first mask and/or the second mask comprises a photoresist.

12. The method of claim 10, wherein the first mask and/or the second mask comprises a metal mask.

13. A method for manufacturing an imaging device, comprising the steps of:
first providing a wafer comprising a substrate having a first surface and a second surface opposite the first surface, and a membrane attached to the first surface, wherein the membrane includes an opening exposing the first surface;
subsequently, depositing a photoresist layer over the membrane and wafer first surface;
after depositing the photoresist layer, masking a portion of the photoresist layer to form a first region and a second region;
subsequently, anisotropic etching a portion of the substrate second surface under a central part of the membrane;
after the anisotropic etching, removing the first region of the photoresist layer;
subsequently, performing a first isotropic etching of the substrate through the membrane opening;
after the first isotropic etching, stripping the second region of the photoresist layer; and
subsequently, performing a second isotropic etching of the substrate through the membrane opening.

14. The method of claim 13, wherein the anisotropic etching comprises DRIE.

15. The method of claim 13, wherein the anisotropic etching penetrates through substantially the whole thickness of the substrate.

16. The method of claim 13, wherein the substrate comprises one or more of the group consisting of silicon, germanium, silicon germanium, and gallium arsenide.

17. The method of claim 13, wherein the step of providing a wafer further comprises the steps of: depositing of a dielectric layer on the wafer first surface; and depositing a backside mask to the wafer second surface.

18. The method of claim 17, wherein the anisotropic etching is performed through an opening in the backside mask located under a central part of the membrane.

19. The method of claim 17, wherein the backside mask is selected from the group consisting of a metal mask, a photoresist mask, and a dielectric mask.

20. A method for manufacturing an imaging device, comprising the steps of:
providing a wafer comprising a first layer, a second layer, and a third layer, the second layer having a front surface adjacent to the first layer and a back surface adjacent to the third layer, the first layer having a pair of inner openings therethrough;
anisotropic etching of a portion of the second layer back surface beneath a central part of the first layer to form a cavity between the pair of inner openings, the pair of inner openings not extending into the cavity, the first layer acting as an etch stop to the anisotropic etching such that the anisotropic etching only etches the entire thickness of the second layer up to the first layer; and
performing a first isotropic etching of a first portion of the second layer front surface through the pair of inner openings to form cavity extensions such that the pair of inner openings provide a channel from a top side of the wager through the first layer into the cavity.

21. A method for manufacturing an imaging device, comprising the steps of:
providing a wafer comprising a first layer, a second layer, a third layer, a CMOS structure, and a photoresist layer, the second layer having a front surface adjacent to the first layer and a back surface adjacent to the third layer, the first layer having a pair of inner openings therethrough and a pair of outer openings therethrough, the at least one CMOS structure disposed on an outer portion of the wafer relative to the pair of outer openings, the photoresist layer disposed on a front surface of the first layer so as to cover at least the pair of outer openings and the CMOS structure;
anisotropic etching of a portion of the second layer back surface beneath a central part of the first layer between the pair of inner openings, the first layer acting as an etch stop layer, to form a cavity in the second layer between the pair of inner openings; and
performing a first isotropic etching of a first portion of the second layer front surface through the pair of inner openings to form first cavity extensions primarily undercutting inwards away from the pair of outer openings and the CMOS structure.

22. The method of claim 21, wherein forming the cavity in the second layer between the pair of inner openings, and providing the photoresist layer so as to cover at least the pair of outer openings and the CMOS structure, and subsequently performing the isotropic etching through the pair of inner openings, controls an outward undercut near the CMOS structure.

23. The method of claim 21, wherein the first cavity extensions are disposed a distance away from the CMOS structure towards an inner portion of the wafer.

24. The method of claim 21, further comprising, after performing the first isotropic etching, removing the photoresist layer and performing a second isotropic etching through the outer openings and/or inner openings to form second cavity extensions.

25. The method of claim 23, wherein the first and second cavity extensions are disposed a distance away from the CMOS structure towards an inner portion of the wafer.

* * * * *